United States Patent [19]

Kuehnert

[11] Patent Number: 4,840,698

[45] Date of Patent: Jun. 20, 1989

[54] APPARATUS FOR LAMINATING A FILM UNDER PRESSURE AND HEAT

[75] Inventor: Hans-Guenter E. Kuehnert, Erzhausen, Fed. Rep. of Germany

[73] Assignees: Hoechst Aktiengesellschaft, Frankfurt am Main; ELTI Apparatebau und Elektronik GmbH, Erzhausen, both of Fed. Rep. of Germany

[21] Appl. No.: 740,831

[22] Filed: Jun. 3, 1985

[30] Foreign Application Priority Data

Jun. 1, 1984 [DE] Fed. Rep. of Germany ....... 3420429

[51] Int. Cl.⁴ .......................... B65C 1/00; B44C 1/00; B65H 5/12
[52] U.S. Cl. .................................... 156/485; 156/212; 156/540; 156/555; 271/268
[58] Field of Search ............... 156/285, 212, 230, 236, 156/238, 361, 353, 354, 355, 383, 468, 483, 484, 485, 539, 530, 531, 511, 512, 579, 489, 496, 540, 552, 555, 576, 584, DIG. 42

[56] References Cited

U.S. PATENT DOCUMENTS

| | | | |
|---|---|---|---|
| 3,284,982 | 11/1966 | Conti | 156/485 |
| 4,026,000 | 5/1977 | Anderson | 156/484 |
| 4,080,732 | 3/1197 | Eberle | 156/484 |
| 4,127,436 | 11/1978 | Friel | 156/285 |
| 4,214,936 | 7/1980 | Del Bianco | 156/361 |
| 4,274,903 | 6/1981 | Mock | 156/355 |
| 4,378,264 | 3/1983 | Pilette et al. | 156/238 |
| 4,464,221 | 8/1984 | Garber | 156/484 |
| 4,491,492 | 1/1985 | Hetherington | 156/485 |
| 4,495,014 | 1/1985 | Gebrian et al. | 156/236 |
| 4,505,772 | 3/1985 | Renz | 156/355 |
| 4,643,415 | 2/1987 | Kuehnert | 271/268 |

FOREIGN PATENT DOCUMENTS

| | | |
|---|---|---|
| 40842 | 12/1981 | European Pat. Off. . |
| 49205 | 4/1982 | European Pat. Off. ............ 156/285 |
| 84077 | 7/1983 | European Pat. Off. . |
| 98451 | 3/1923 | Switzerland ........................ 156/485 |

Primary Examiner—Michael W. Ball
Assistant Examiner—Louis Falasco
Attorney, Agent, or Firm—Foley & Lardner, Schwartz, Jeffery, Schwaab, Mack, Blumenthal & Evans

[57] ABSTRACT

Apparatus for laminating a film onto a carrier. A carrier, such as, for example, a printed circuit board, a multi-layer lamination, a metal plate or a carrier layer with metal layers coated on both sides, is heated in a horizontal position over its entire surface in a heating station and is guided up to a photoresist film which is fixed vertically on suction plates of vacuum tables and which also spans a laminating station located between the vacuum tables. The photoresist film is drawn off from a single supply roll by means of a gripper bar and is guided over the vacuum tables and the laminating station. A cutting device cuts through the photoresist film transversely to its longitudinal direction. The carrier touches the photoresist film at the height of the laminating station, so that the carrier, transported further, is pushed into the nip between the rotating laminating rollers of the laminating apparatus, is grasped by the rollers and transported through the laminating station, together with the photoresist film which is laid onto the top side and underside of the carrier.

35 Claims, 9 Drawing Sheets

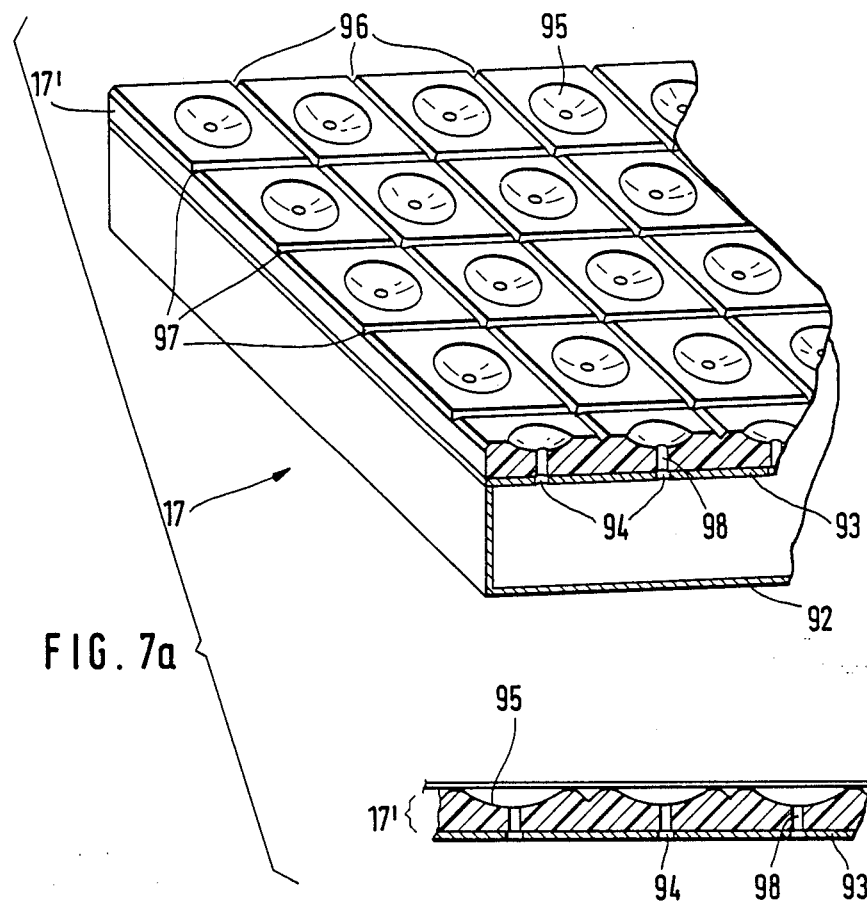
FIG. 7a
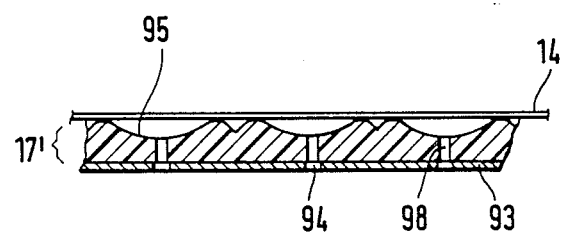
FIG. 7b
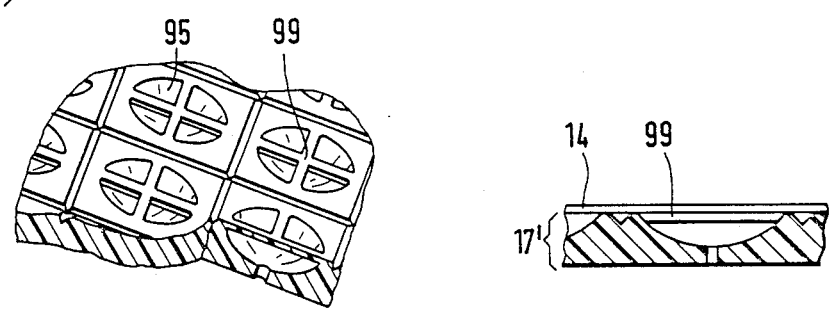

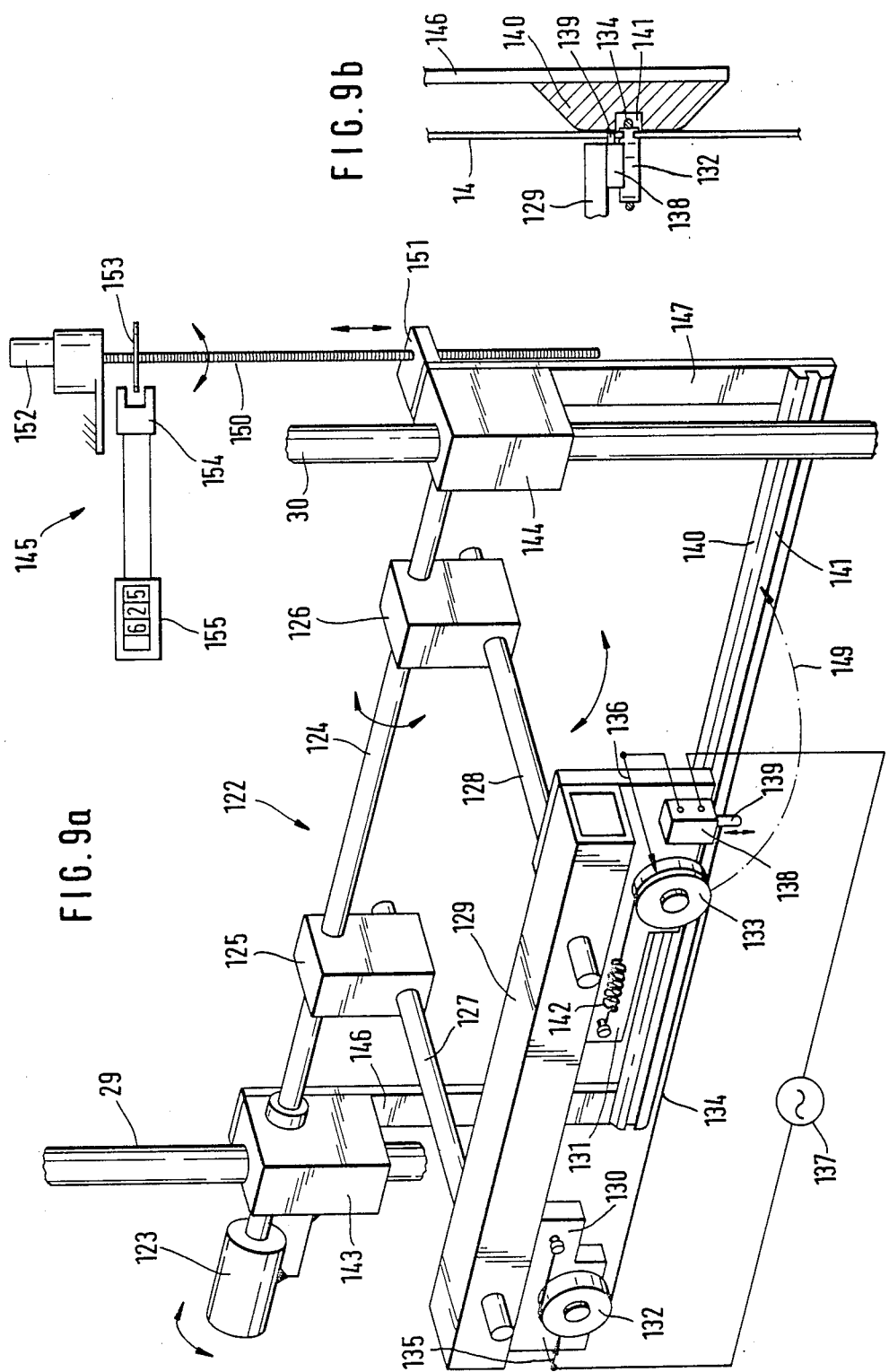

APPARATUS FOR LAMINATING A FILM UNDER PRESSURE AND HEAT

BACKGROUND OF THE INVENTION

The invention relates to a process for laminating a film under pressure and heat onto the opposite sides of a carrier, the two sides of which are heated, and to an apparatus for carrying out this process.

The process of the invention includes coating a uniform film of photoresist material onto the two sides of a carrier which is, for example, a metal board or a carrier body with metal layers vapor-deposited and/or glued on both sides.

Laminating processes are known from the preliminary published European patent application Nos. 0,040,842, 0,040,843 and 0,041,642, and in these a substrate or a carrier is laminated on both sides with a dry resist under applied pressure. The dry resist for the particular side of the carrier, for example a printed circuit board, to be laminated is drawn off from a supply roll and supplied to a pair of laminating rollers, through whose nip run the two dry resist films and the carrier located between them. Before lamination, a thin liquid layer is coated onto the surface of the carrier or the printed circuit board and forms an intermediate layer between the surface of the printed circuit board and the particular dry resist film during the laminating operation. This thin liquid layer is removed from the surface of the printed circuit board, during lamination, by being absorbed into the dry resist film.

U.S. Pat. No. 4,214,936 relates to a laminating process, in which horizontally transported boards, which are moved forwards continuously and contact-heated, are laminated on both sides, the peripheral speed of the laminating rollers being greater than the feed speed of the boards. As soon as a sensor detects the rear edge of the preheated board shortly before it enters the nip between the laminating rollers, the latter are stopped only after a certain delay time, allowing the rear edge of the board to pass through the laminating nip. As soon as the front edge of the following board is detected, the laminating rollers start to rotate again and the board which has entered the nip is laminated. This operation is repeated for each new board, and a uniform distance between the individual laminated boards is thus maintained after the nip. This results in a continuous strip composed of two dry resist layers, between which the boards are enclosed at equal distances from one another. The connecting length of the resist layers between two boards amounts, for example, to 18 mm.

In the known laminating processes, the dry resist films laminated onto the board are always supplied to the laminating station from two supply rolls, so that a double outlay is required for providing a stock of the dry resist films. Another advantage of the laminating process according to the above U.S. patent is that there is a relatively large amount of waste dry resist, since the individual boards are joined together by means of connecting pieces consisting of dry resist, and these connecting pieces have to be cut through and cut off so that the individual laminated board can undergo further processing. Because of the connecting pieces between the individual boards, there is no guarantee that the individual board will be laminated uniformly in the transitional region from the board to the connecting pieces, so that under certain circumstances, after the connecting pieces have been cut through, the photoresist will possibly come loose in the edge region of the board.

SUMMARY OF THE INVENTION

It is accordingly an object of the invention to provide a process and apparatus for laminating a film, such as, for example, a photoresist film, onto a carrier.

It is another object of the invention to provide a process and apparatus, as above, which allows the photoresist to be laminated onto the two sides of the carrier uniformly and without creases on both sides.

Yet another object of the invention is to provide a process and apparatus, as above, which ensures only very small losses as a result of photoresist waste cuttings.

These objects are achieved, according to the invention, by means of a process comprising the steps of heating the carrier on both sides in a horizontal position over its entire surface, drawing a predetermined length of film from an individual supply roll, guiding the film vertically over the top side of vertically aligned vacuum tables and through a laminating station located between the tables, fixing the film vertically by means of the vacuum tables, cutting through the film in the region between the laminating station and the top edge of the vacuum table located above the laminating station, transporting horizontally and guiding the heated carrier up to the vertically fixed film at the height of the laminating station, pushing the carrier into the laminating station, and drawing the film into the nip between two laminating rollers of the laminating station by means of the pushed carrier, the laminating rollers rotating and thereby transporting through horizontally the composite structure comprising the carrier and the film, the film simultaneously being laid onto the opposite sides of the carrier, and being laminated thereby onto the two sides of the carrier with pressure contact.

The apparatus for carrying out the process includes a supply roll of photoresist in the form of a film, a magazine for receiving the carriers to be laminated, a heating means for the carriers, a laminating station consisting of two laminating rollers, vacuum tables for fixing the photoresist, and a cutting device for cutting the photoresist. In the apparatus, the carrier runs horizontally over a roller conveyor through the heating means, an aligning device and a board gripper, and with its front edge abuts against a parallel stop which can be pivoted into and out of the path of the roller conveyor. A vacuum table with a vertical suction plate is arranged both above and below the laminating station, and a gripper bar grasps a strip-shaped portion of the photoresist film and moves vertically downwards, along vertical guide rods parallel to one another, out of an adjustable position above the laminating station, across the laminating station and into a position in the region of the lower vacuum table.

BRIEF DESCRIPTION OF THE DRAWINGS

The invention is explained in more detail below with reference to the drawings, wherein:

FIGS. 9a and b show a partial perspective view and a side view of a cutting device for severing the photoresist film.

DETAILED DESCRIPTION OF THE PREFERRED EMBODIMENTS

Figure 1:
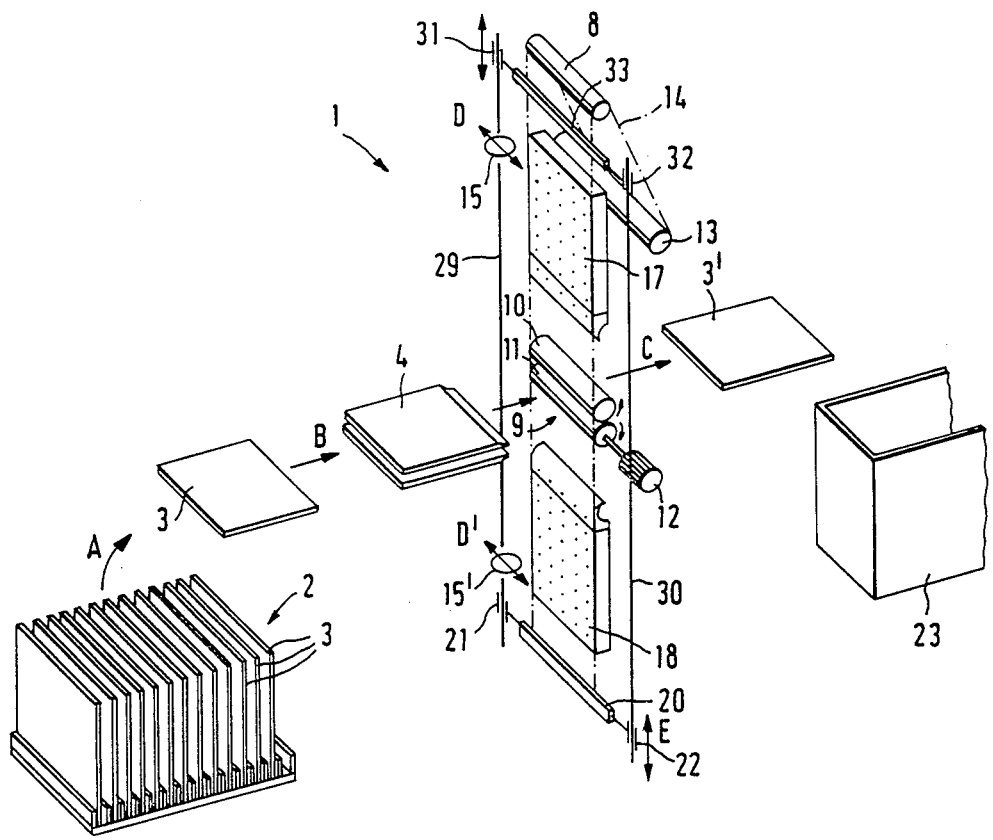
FIG. 1 shows a diagrammatic exploded representation of the individual stations of the apparatus according to the invention.

A laminating apparatus 1 illustrated diagrammatically in FIG. 1 contains, in a supply magazine 2, carriers 3, such as, for example, printed circuit boards, multi-layers metal plates or the like, onto which a photoresist film 14 is to be laminated on both sides. The carrier 3 is grasped in the supply magazine 2, pivoted horizontally in the direction of the arrow A and transported in the direction of the arrow B on a roller conveyor (not shown) into a heating station. The design and mode of operation of the heating station 4 will be described later. In the heating station 4, the two sides of the carrier 3 are heated over their entire surface, and after heating has ended the carrier 3 is transported towards a laminating station 9. The laminating station 9 consists of two laminating rollers 10 and 11, of which, for example, the lower laminating roller 11 is driven by a motor 12. Of course, the upper laminating roller can also be driven by a motor instead of the lower laminating roller. The other laminating roller is then always driven in synchronous fashion via gear wheels, chain wheels with a chain or the like.

Located above the laminating station 9 is a vertically aligned vacuum table 17, and underneath the laminating station 9 there is a further vertically aligned vacuum table 18. The vacuum tables 17 and 18 are shown pulled apart from one another in an exploded view. In a practical embodiment of the laminating apparatus 1, as shown by way of example in FIGS. 2 to 4, the vacuum tables 17 and 18 are located nearer to the laminating station, and their edges opposite one another are at a distance from one another which is only slightly greater than the nip between the two laminating rollers 10 and 11.

A single supply roll 13 for the photoresist film 14 is arranged laterally behind the upper vacuum table 17. The photoresist film 14 is guided obliquely upwards from the supply roll 13, round a deflecting and film-transport roller 8, and is thereafter deflected vertically onto the suction plate of the vacuum table 17. From the vacuum table 17 the film 19 moves downwards over the laminating station 9 onto the suction plate of the vacuum table 18. It is pointed out, in this connection, that FIG. 1 merely illustrates a diagram of the laminating apparatus 1, individual components and stations of the laminating apparatus being omitted for sake of greater clarity, since they are moreover illustrated in any case in the following Figures and described with reference to these Figures.

A cutting device 15 is shown diagrammatically near the top edge of the upper vacuum table 17 and takes the form of a rotary knife which is vertically adjustable and which can be moved over the vacuum table 17 in the direction of the double arrow D. Reference numeral 15' indicates a position of the cutting device in the region of the lower vacuum table 18. In this position, the cutting device can likewise be moved transversely over the vacuum table 18 in the direction of the double arrow D'. The two vacuum tables 17, 18 are fixed in place, and their upper covering surfaces are formed by suction plates with small holes. The cutting device 15 is movable along guide rods 29 and 30 which extend vertically on both sides of the vacuum tables 17 and 18. Two guides 31 and 32 sliding along the guide rods 29 and 30 are connected to a cross-member 33, to which a pivotable knife carrier to be described later, having a rack for the cutting device 15, is fastened by means of two arms. A gripper bar 20 is connected to guides 21 and 22 which are displaceable along the guide rods 29 and 30 in the direction of the double arrow E. In its upper position, the gripper bar grasps the photoresist film 14 guided round the deflecting and film-transport roller 8 and is subsequently moved over the vacuum table 17 and the laminating station 9 in the direction of the bottom edge of the lower vacuum table 18 into a position corresponding to the size of the board surface to be laminated. During this movement, a vacuum prevails within the vacuum tables 17 and 18, so that the photoresist film 14 can be guided free of creases over and beyond the suction plates of the vacuum tables 17 and 18.

As soon as the gripper bar 20 has reached its end position, the vacuum tables 17 and 18 remain subjected to suction air and the photoresist film 14 thereby remains fixed free of creases on the suction plates of the vacuum tables. At the same time, the photoresist film 14 also spans the nip between the laminating rollers 10 and 11. The carrier 3 heated on both sides in the heating station 4 is transported horizontally out of the heating station 4 up to the nip between the two laminating rollers 10 and 11, after being previously aligned at a board stop (not shown). As soon as the heated carrier touches the vertically fixed photoresist film 14, the carrier 3 grasped by the rotating laminating rollers 10 and 11 is drawn into the nip together with the released photoresist film 14. The laminating rollers 10 and 11 transport the composite structure, consisting of the carrier 3 and the photoresist film 14 being laid simultaneously onto its top side and underside, through the laminating station 9 in the direction of the arrow C. When the carrier 3 passes through the laminating station 9, the photoresist film 14 is laminated with pressure contact onto the two sides of the carrier 3, and the laminated carrier 3' emerges from the laminating station. It is transported away horizontally for further processing or for deposition in a collecting container 23.

The diagrammatic drawing according to FIG. 1 does not show all the process stations of the laminating apparatus, these being illustrated by way of example in FIGS. 2 to 9b.

Figure 2:
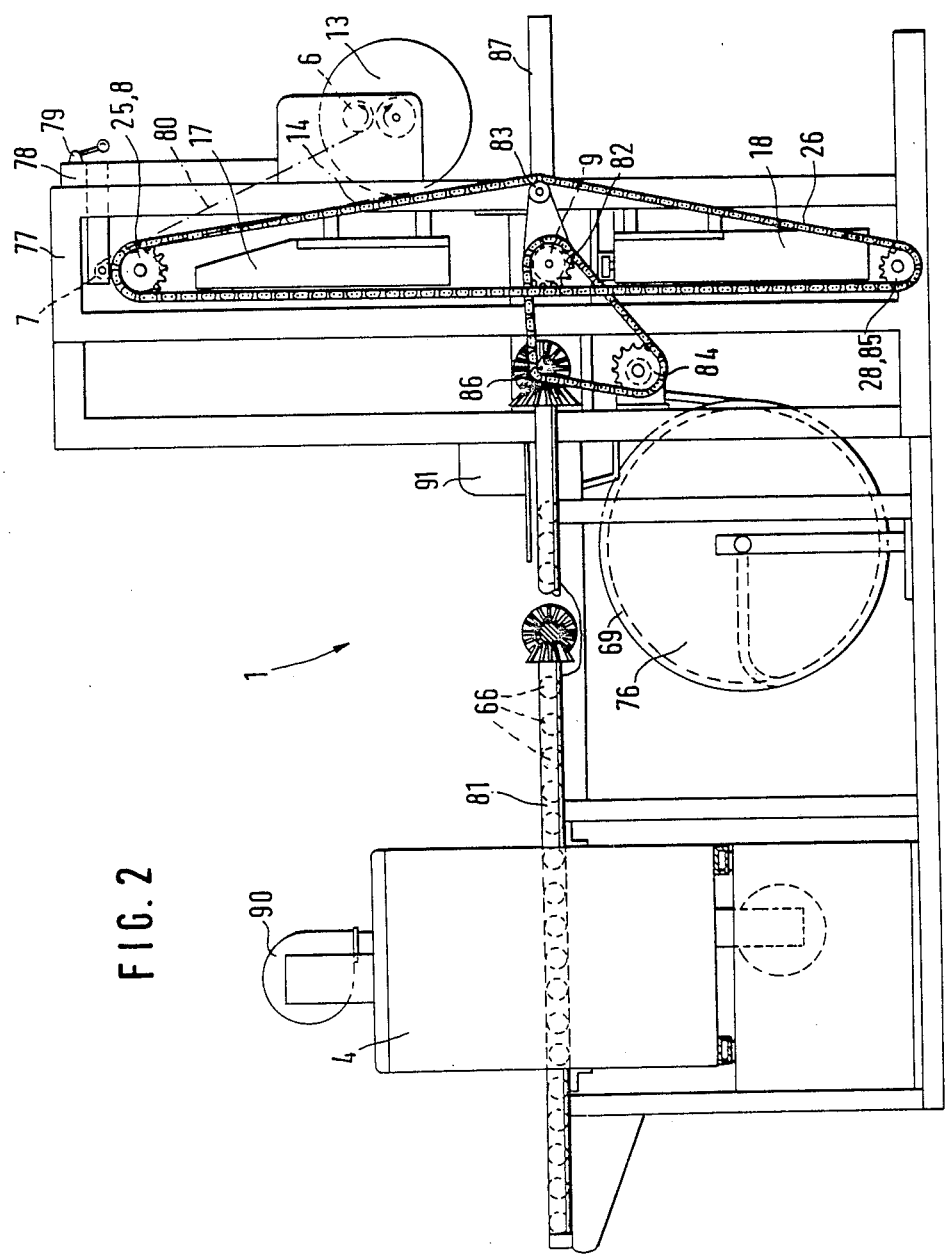
FIG. 2 shows a side view of the essential part of the apparatus.

In FIGS. 2 to 9b, corresponding components bear the same reference numerals. FIG. 2 shows a sectional view and FIG. 3 the associated plan view of the laminating apparatus 1. A carrier 3 transported from left to right is transported through the heating station 4 along a roller conveyor 66 with one or more driven rollers. The heating station 4 completely surrounds the roller conveyor 66 and has both in its part located above the roller conveyor 66 and in its part located underneath the roller conveyor 66 one heat radiator in each case for the uniform surface heating of the top side and underside of the carrier 3. Fans in the heating station 4 ensure appropriate air circulation in the interior of the heating station, in order to heat the carrier uniformly.

Figure 4:
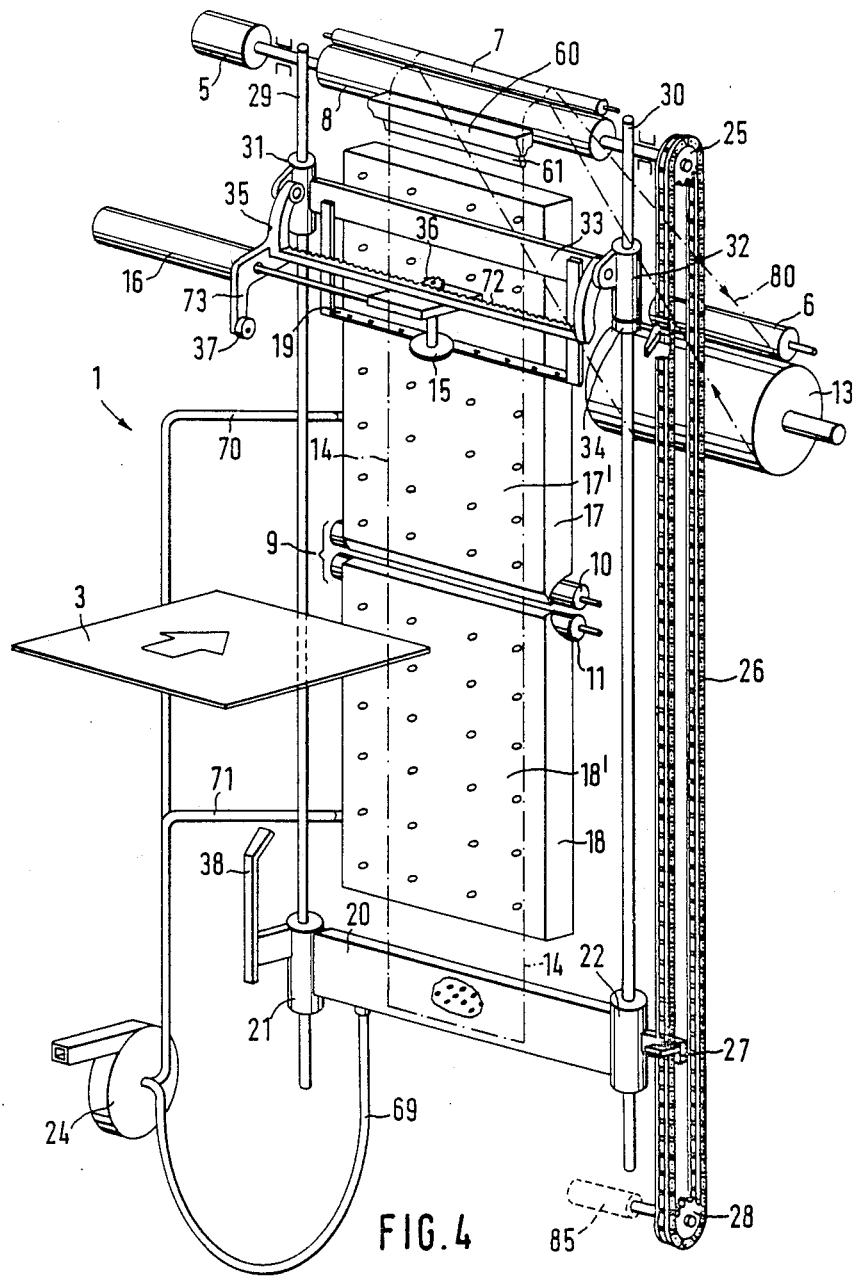
FIG. 4 shows a perspective view of the vacuum tables together with the associated devices and the laminating station.

As the heated carrier 3 emerges from the heating station 4, it is first aligned laterally on the roller conveyor 66 in a way not shown, and subsequently transported in the direction of a parallel stop 39 which will be described in more detail later with reference to FIGS. 5 and 6. The board stop 39 serves for aligning the front edge of the carrier 3 before the latter is transported into the laminating station 9. Located between the heating station 4 and the laminating station 9, underneath the roller conveyor 66, is a wind-on reel 76 for a vacuum line 69 (FIG. 4) connected to the gripper bar 20 in the form of a vacuum bar. A motor 84 constitutes the main drive for the laminating apparatus 1 and, for example, drives a gear wheel chain which is guided endlessly over a double chain wheel 82 and a bevel wheel 86 and over a gear wheel located on the drive shaft of the motor 84. The bevel wheel 86 is engaged with a shaft 81 which drives one or more rollers of the roller conveyor 66. An endless chain guided over the double chain wheel 82 and a roller 83 at the discharge of the laminating station 9, specifically at the start of a discharge track 87, drives the roller 83 to transport away the laminated carrier 3' emerging from the laminating station 9. The upper vacuum table 17, the lower vacuum table 18 and the laminating station 9, of which FIG. 2 indicates only the lower laminating roller concealed in the view by the double chain wheel 82, are arranged in a main frame 77. The upper laminating roller is not shown in FIG. 2. In the main frame 77, a drive chain 26, which is described in more detail with reference to FIG. 4, is guided endlessly round an upper chain wheel 25 and a lower chain wheel 28. A pivoting frame 78 is articulated laterally on the main frame 77 and is connected firmly to the main frame 77 by means of a locking device 79.

As shown in FIG. 2, the locking device 79 is arranged at the top of the pivoting frame 78, but it can also be provided in the lower region of the pivoting frame 78. The supply roll 13 for the photoresist film 14 and a take-up roller 6 for a protective film 80 covering the photoresist film 14 are mounted in the pivoting frame 78. The protective film 80 is separated from the photoresist film 14 by means of a pressure and separating roller 7 in the region of the deflecting and film-transport roller 8, which is concealed by the chain wheel 25 in the view shown in FIG. 2, and is guided round this pressure and separating roller 7 and wound onto the take-up roller 6.

Figure 3:
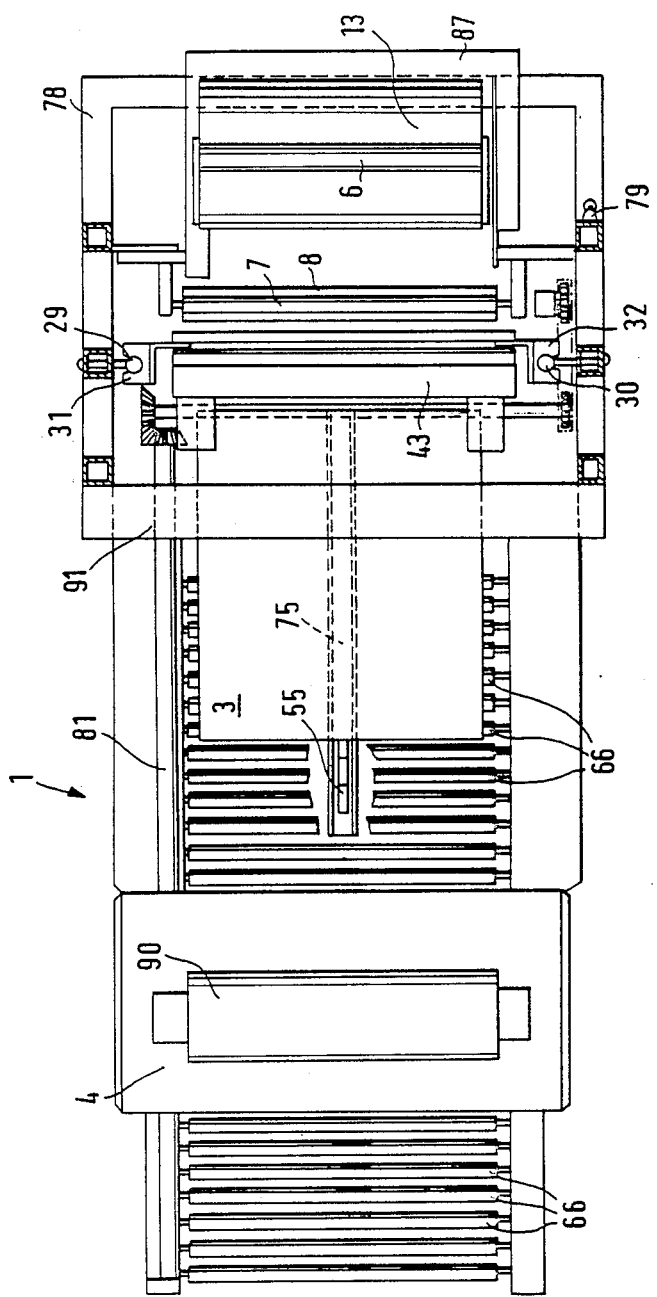
FIG. 3 shows a plan view of the part according to FIG. 2.

In the plan view according to FIG. 3, the upper fan 90 of the heating station 4 is shown only diagrammatically in order to simplify the drawing. After the heating station 4, a guide 75, in which a pivotable transport finger 55 can be displaced, extends along the center line of the roller conveyor 66. This transport finger 55, when upright, rests against the rear edge of the carrier 3 and transports it in the direction of the laminating station 9. The plan view shows an aligning device 91 for the lateral alignment of the carrier, the parallel stop 39 for aligning the front edge of the carrier 3, and a board gripper 43 which is brought near to the laminating station. Guides 31 and 32 are movable along guide rods 29 and 30 and are connected to one another by means of a cross-member 33 (FIG. 4).

FIG. 4 shows in a perspective view the core piece of the laminating apparatus 1. In comparison with the laminating apparatus according to FIGS. 2 and 3, this laminating apparatus also incorporates a coating device 60 for coating a liquid layer onto the front side of the photoresist film 14 transported downwards over the vacuum tables 17 and 18. The coating device 60 contains a wiper blade 61 which projects from the coating device and which rests against that surface or side of the photoresist film 14 which comes up against the two sides of the carrier 3 during lamination and which adheres to the top side and underside of carrier 3 after lamination. A liquid layer of the order of magnitude of up to 100 microns thick is coated on the photoresist film by means of the wiper blade 61. This liquid layer consists, for example, of a mixture of distilled water and methanol, ethanol or fluorocarbon solutions of alcohols. The liquid layer can also be a layer of bonding agent containing a small quantity of dissolved photoresist material which forms a filler for very slight unevenness of the surface of the carrier 3. When the photoresist film 14 is laminated onto the top side and underside of the carrier 3, the purpose of the liquid layer is, above all, to prevent air inclusions from forming and thereby accelerate and improve bonding.

The wiper blade 61 appropriately consists of a material of specific capillarity, such as, for example, a felt-like or wick-like material. Other coating devices, such as spray devices, doctor devices with a damming effect, coating rollers or the like, can also be used.

In the laminating apparatus 1 according to FIG. 4, the already heated and aligned carrier 3 is shown shortly before it enters the nip between the two laminating rollers 10 and 11. The vacuum tables 17 and 18 with their vertical suction plates 17' and 18' are arranged above and below the laminating station 9. The design of the vacuum tables 17 and 18 will be described in more detail. The laminating station 9 is the subject of U.S. patent application Ser. No. 06/740,554 now U.S. Pat. No. 4,643,415 which was filed on the same day as the present application.

Located underneath the lower vacuum table 18 is the gripper bar 20 which is designed as a vacuum bar and which is connected via the flexible vacuum line 69 to a vacuum pump 24 indicated diagrammatically. As already mentioned in relation to FIG. 2, this flexible vacuum line 69 can be wound onto the wind-on reel 76 shown in FIG. 2 or unwound from this reel during the vertical to and fro movement of the gripper bar 20. The gripper bar 20 is connected to two guides 21 and 22 which can be displaced along the guide rods 29 and 30 by means of the drive chain 26. A chain connection 27 which is connected frictionally to the drive chain 26 is attached to one guide 22 of the gripper bar 20. The drive chain 26 is guided endlessly round the chain wheels 25 and 28 and is set in motion, for example, by a motor 85 connected to the lower chain wheel 28. The motor 85 is shown by broken lines in FIG. 4, to indicate that it represents only one alternative possibility of driving the drive chain 26 which is preferably driven via the upper chain wheel 25 located on the shaft of the deflecting and film-transport roller 8 which itself is made to rotate by the drive motor 5. It goes without saying that either the drive motor 5 only or the motor 85 only is present, but not both motors at the same time.

The drive motor 5 drives the deflecting and film-transport roller 8 in one direction only. The other direction is blocked by means of a return stop, to prevent the photoresist film 14 from being transported backwards when the gripper bar 20 is raised.

The single supply roll 13 for the photoresist film 14 of the laminating apparatus 1 is located behind the upper vacuum table 17 in the direction of transport of the carrier 3, and is mounted in the pivoting frame 78 which is omitted in FIG. 4 for the sake of greater clarity, but which is shown in FIGS. 2 and 3, and which can be pivoted horizontally about a vertical axis. As a result, it is possible, when required, to exchange the supply roll 13 without difficulty by pivoting the pivoting frame away from the main frame. The photoresist film 14 from the supply roll 13 is guided round the deflecting and film-transport roller 8, and a strip-shaped portion of the photoresist film 14 is grasped by the gripper bar 20, which at that time is raised, and is transported downwards over the suction plates 17' and 18' of the vacuum tables 17 and 18. When the photoresist film 14 is deflected round the deflecting and film-transport roller 8, the protective film 80 adhering to the photoresist film 14 is drawn off and guided via the pressure and separating roller 7 to the take-up roller 6 located near the supply roll 13. The coating device 60, the wiper blade 61 of which rests against the photoresist film 14, is located at a short distance underneath the deflecting and film-transport roller 8.

The vacuum tables 17 and 18 are connected to the vacuum pump 24 via vacuum lines 70 and 71. A knife carrier 35 has a rack 72 and is mounted pivotably on the guides 31 and 32 which are displaceable along the guide rods 29 and 30. The guides 31 and 32 are connected by means of the cross-member 33, to which a rail 19 extending transversely to the photoresist film 14 and having cutting edges is fastened by means of appropriate struts not shown in any more detail. A clamping piece 34 with a handle is attached to one guide 32 and makes it possible to fix or clamp the cross-member 33 and the parts connected to it at the desired height on the guide rods 29 and 30. Instead of the clamping piece which operates mechanically, it is preferable to provide an electromotively actuated positioning device which moves the cross-member along the guide rods 29, 30 and fixes it. A gear 36 for the knife drive is engaged with the rack 72, is driven by a motor 16 and is moved over the width of the photoresist film 14. The gear 36 drives the cutting device 15 connected to it, for example a rotary knife, makes the cutting device rotate, and moves it along the cutting edge of the rail 19 over the photoresist film 14 during the cutting operation. An angular arm 73 arranged on the knife carrier 35 carries at its free end a cam roller 37 pointing inwards, that is to say facing the edge of the photoresist film 14.

An angled cam piece 38 fastened to one guide 21 of the gripper bar 20 comes in contact with the cam roller 37 when the gripper bar 20 is raised, and this cam roller 37 rolls on the cam piece 38 and thereby lifts the angular arm 73 and the knife carrier 35, together with the cutting device 15, off from the photoresist film 14. It is thereby possible for the gripper bar 20 to be moved through upwards under the knife carrier 35, lifted off from the surface of the photoresist film 14, and the cutting device 15 lifted-off, until a strip of photoresist film 14 underneath the cross-member 33 can be sucked and retained against the gripper bar 20 when a vacuum is applied.

Because the deflecting and film-transport roller 8 is driven by means of the motor 5, the drawing off of the photoresist film 14 from the supply roll 13 by the gripper bar 20 moving downwards is considerably assisted and made easier. It is advantageous, here, that the rotary movement of the deflecting and film-transport roller 8 and the downward movement of the gripper bar 20 are synchronized with one another via the common drive by means of the drive chain 26.

Figure 5:
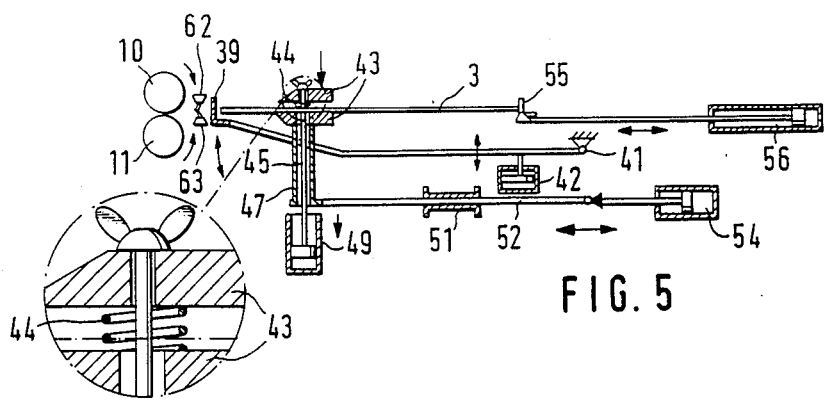
FIG. 5 shows a diagrammatic picture of the laminating station and of the gripper and transport devices for the carrier which, as seen in the direction of transport of the carrier, are arranged in front of the laminating station.
Figure 6:
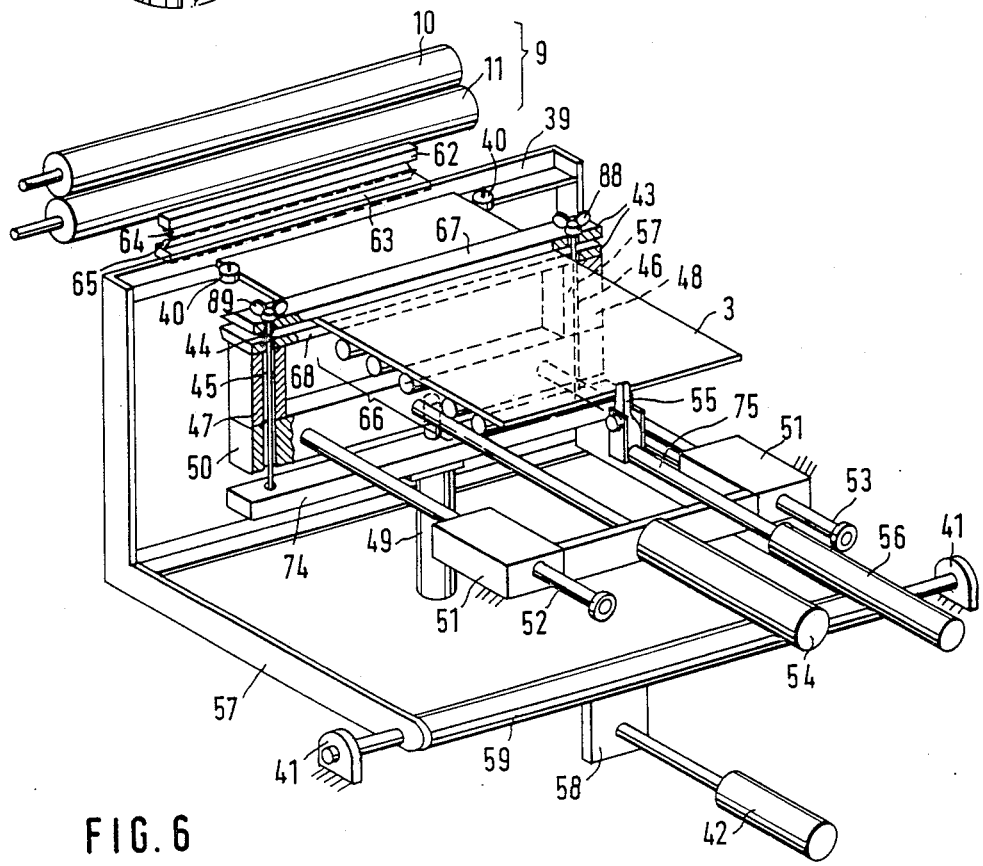
FIG. 6 shows a perspective view of the components and devices illustrated diagrammatically in FIG. 5.

FIG. 5 shows diagrammatically and FIG. 6 shows in perspective a part of a further laminating apparatus 1 which is located in front of the laminating station 9 and which comprises the parallel stop 39, the roller conveyor 66 and the board gripper 43 together with the respective actuating mechanisms. In this laminating apparatus 1, in contrast to those according to FIGS. 2 to 4, coating devices 62 and 63 for coating a liquid layer onto the top side and underside of the horizontally transported carrier 3 are arranged between the laminating station and the parallel stop 39 swung into the path of the roller conveyor 66. It goes without saying that, in this embodiment of the laminating apparatus, the coating device 60 contained in FIG. 4, intended for coating a liquid layer onto the front side of the photoresist film 14 transported downwards over the vacuum tables 17 and 18, near to the deflecting roller 8 for the photoresist film, is omitted. On the other hand, the two coating devices 62 and 63 shown in FIG. 6 are not required in the laminating apparatus 1 according to FIG. 4. The two laminating apparatus differ from one another in that, in the laminating apparatus according to FIGS. 2 to 4, a liquid layer is coated directly onto the photoresist film 14, whereas in the laminating apparatus 1 according to FIGS. 5 and 6 the liquid layer is coated onto the top side and underside of the carrier 3. In practice, of course, a laminating apparatus 1 will also be used which works without coating a liquid layer onto the photoresist film or onto the top side and underside of the carrier 3, and in which the photoresist film is laminated on solely by means of applied heat and pressure.

The coating devices 62 and 63 have a design corresponding to that of the above-described coating device 60, and the wiper blades 64 and 65 rest respectively against the top side and underside of the carrier 3. The liquid layer to be coated on corresponds substantially to the liquid layer described above in relation to the coating device 60.

The parallel stop 39 is fastened to two angle levers 57, 57 which are connected to one another at one end via a cylindrical connecting member 59, whilst the other end of the angled levers carries the parallel stop 39. This parallel stop 39 has, for example, an angular design, and arranged on it are two small horizontally pivotable guide rollers 40, 40 which come up against the longitudinal edges of the carrier 3 when its front edge rests against the parallel stop 39 and is aligned. The axle of the connecting member 59, extended beyond the angle levers 57, 57 is mounted rotatably in bearings 41, 41. Located on the connecting member 59 is a plate 58, on which an actuating cylinder 42 for the angle levers 57, 57 engages, to pivot the latter and consequently the parallel stop 39 into and out of the path of the carrier 3.

The horizontally movable board gripper 43 comprises two horizontal clamping jaws 67 and 68 which are arranged above one another and between which are arranged springs 44, 44 surrounding drawbars 45 and 46 and intended for opening the board gripper 43. The draw bars run in guides 47 and 48 and pass through the clamping jaws 67 and 68. Furthermore, the drawbars 45 and 46 are connected to the cross-strut 74 of the board gripper 43 and each have at the top end a thread which is screwed to a wing nut 88 or 89 respectively belonging to it and located above the upper clamping jaw 67. When the piston of the cylinder 49 is retracted, the cross-strut 74 is pulled downwards, and at the same time the upper clamping jaw 67 connected to the cross-strut 74 via the drawbars 45 and 46 is moved downwards counter to the spring force of the springs 44, 44, until it comes up against the top side of the carrier 3 and grasps the carrier. Two horizontal guide rods 52, 53 parallel to one another and extending through guide bearings 51, 51 are fastened to the support 50 of the board gripper 43 which is located underneath the clamping jaws 67, 68. An actuating cylinder 54 engages on the support 50 and moves the board gripper 43 to and fro horizontally.

The pivotable transport finger 55 arranged in front of the roller conveyor 66 as seen in the direction of transport of the carrier 3 is displaced to and fro by means of a cylinder 56 and stands upright out of its initial pivoted position as a result of its own weight. This occurs as soon as the rear edge of the carrier 3 has passed the transport finger 55. The swung-up transport finger 55 rests against the rear edge of the carrier 3 and pushes the latter forwards until its front edge comes up against, and is aligned by, the parallel stop 39, which has been swung into the path of the carrier 3. As soon as this has happened, the transport finger 55 is moved back into its initial position by means of the cylinder 56 and is pivoted by the carrier running over it. At the same time, the parallel stop 39 is pivoted out of the path of the carrier 3, the board gripper 43 is closed, and the retained carrier 3 is transported further by the board gripper 43 in the direction of the laminating station 9. As soon as the laminating rollers 10 and 11 grasp the front edge of the carrier 3, the board gripper 43 opens to release the carrier 3 and is moved back into its initial position.

Instead of the gripper bar 20 in the form of a vacuum bar, it is also possible to provide a mechanical gripper device consisting of battens of tooth-like profile, of which, for example, the upper batten is spring-loaded. The gripper device is opened and closed by means of an eccentric which carries a cam. In the closing position, a lever of the eccentric rests against a stop, with the result that the eccentric is set parallel and the spring-loaded upper batten is pressed down. In the opening position, the lever rests against another stop, is set on edge and presses the two battens apart from one another counter to the spring pressure exerted on the upper batten, in order to release the photoresist film. The gripper device is moved vertically over the vacuum tables via the chain drive, a rack, or pneumatic means. The mechanical gripper device is described in more detail in U.S. patent application Ser. No. 06/740,554 now U.S. Pat. No. 4,643,415, having the same filing date as the present application.

Various designs of the suction plate 17' of the vacuum table 17 are illustrated in FIGS. 7a, b, c and d. The vacuum table 18 and its suction plate 18' are of a design identical to this. The primary purpose of the vacuum tables is always to exert on the sucked-up photoresist film a suction force only so high that it becomes possible to draw the photoresist film over the suction surface without difficulty and without danger of damaging.

As was described with regard to FIG. 4, a housing 92 of the vacuum table 17 is connected to the vacuum pump 24. A sheet-metal housing 93 attached to the housing 92 has connecting orifices 94 which make the connection via bores 98 between the interior of the housing 92 and shaped bores 95 in the suction plate 17' which are arranged in rows and columns. The suction plate 17' is, for example, a plastic panel made of Hostaform ®, and about 5 mm thick, which is provided with two grid groups of milled grooves 96, 97 which are parallel to one another in groups and the depth of which is up to 3 mm. The distances between the center lines of two adjacent grooves 96, 96 or 97, 97 parallel to one another are between 15 and 25 mm. The cross-section of the grooves is triangular, but can also be rectangular, semi-circular or of another form. The width of the individual groove in the plane of the suction plate 17' corresponds approximately to the groove depth.

The shaped bores 95 form cup-shaped recesses in the suction plate 17', the diameter of the shaped bores in the plane of the suction plate surface being between 10 and 20 mm, and between the edge of the individual shaped bore 95 and each of the four groove portions surrounding the shaped bore in a square there is a web of 1 to 1.5 mm. From the deepest point of each shaped bore 95, a bore 98 in the suction plate 17' makes the connection with the associated connecting orifice 94 in the sheet-metal housing 93. The grooves 96 and 97 are not connected to the vacuum pump and serve solely for limiting the suction effect exerted on the photoresist film 14 to the surfaces of the individual shaped bores 95. This means, in other words, that the grooves interrupt the continuous vacuum surface forming round a shaped bore 95, so that it is not possible for a continuous vacuum to be established from one shaped bore to another, and therefore the total suction force exerted in the region of the suction plate 17' does not become so great as to make it difficult or impossible to displace or draw the photoresist film 14 over the vacuum table.

Figure 7C:
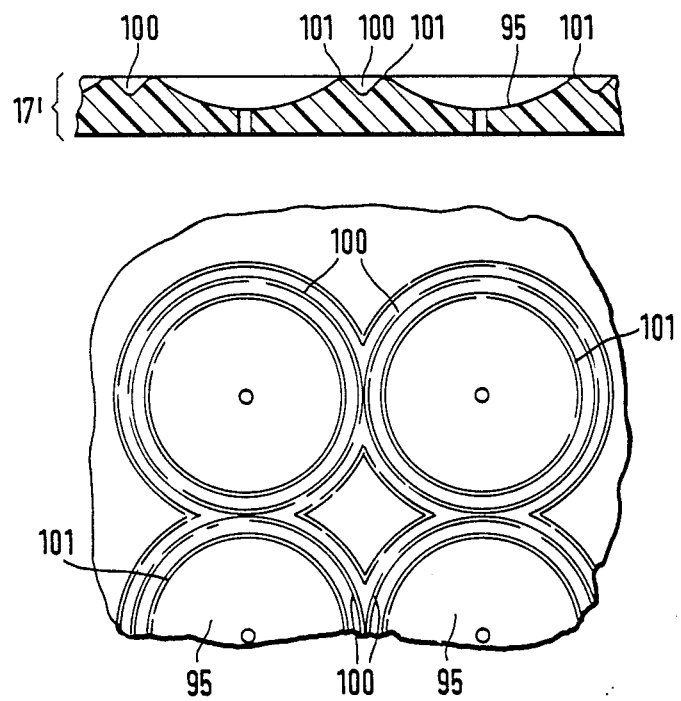
FIGS. 7a, b, c and d show various designs of suction plates of the vacuum tables.

FIG. 7b shows another embodiment of the suction plate of the vacuum table, which is particularly suitable for brittle photoresist films of low strength, to prevent damage to the photoresist film along the edges of the shaped bores. Such damage could be caused if the applied vacuum drew the photoresist film more or less sharply into the interior of the shaped bores. To prevent this, there is in each shaped bore 95 a cross-shaped web 96, the top edges of which end flush with the surface of the suction plate 17', so that, in the region of the shaped bore 95, the photoresist film 14 is supported in the plane of the suction-plate surface and does not have to span the shaped bore freely. The dimensions and other design features of the suction plate 17' are identical to those of the embodiment according to FIG. 7a. FIG. 7c shows an embodiment of the suction plate 17' which is inexpensive to produce and in which, instead of straight grooves, annular grooves 100 surround each individual shaped bore 95 and form relief channels for restricting the applied vacuum to the surface of the individual shaped bore. These relief channels can be produced by means of appropriately designed profiling cutters in one operation together with the shaped bores. Between the edge of the shaped bore 95 and the groove 100 surrounding it, there is a circular web 101 approximately 1 to 1.5 mm wide. Adjacent grooves 100 of the shaped bores arranged in rows and columns merge into and overlap one another. The further design of the suction plate corresponds to that according to FIG. 7a.

Figure 7D:
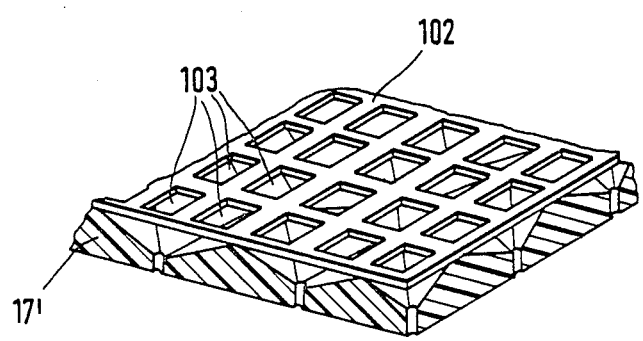
Figure 7D:
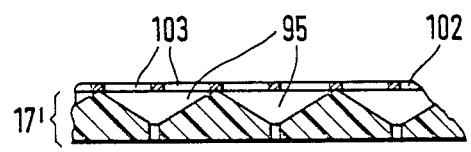

A further embodiment of the suction plate 17', illustrated in FIG. 7d comprises, in addition to the suction plate 17' with the shaped bores 95, a perforated plate 102 fastened on top of the suction plate and having rectangular or square perforations 103 of equal size which are arranged in rows and columns. The dimensions of the perforations 103 are selected so that, for example, four perforations come to rest above a shaped bore 95. The webs between the perforations ensure that vacuum regions separated from one another are generated within the four perforations above the individual shaped bore, and consequently the suction force exerted on the photoresist film does not exceed a specific intensity.

Figure 8:
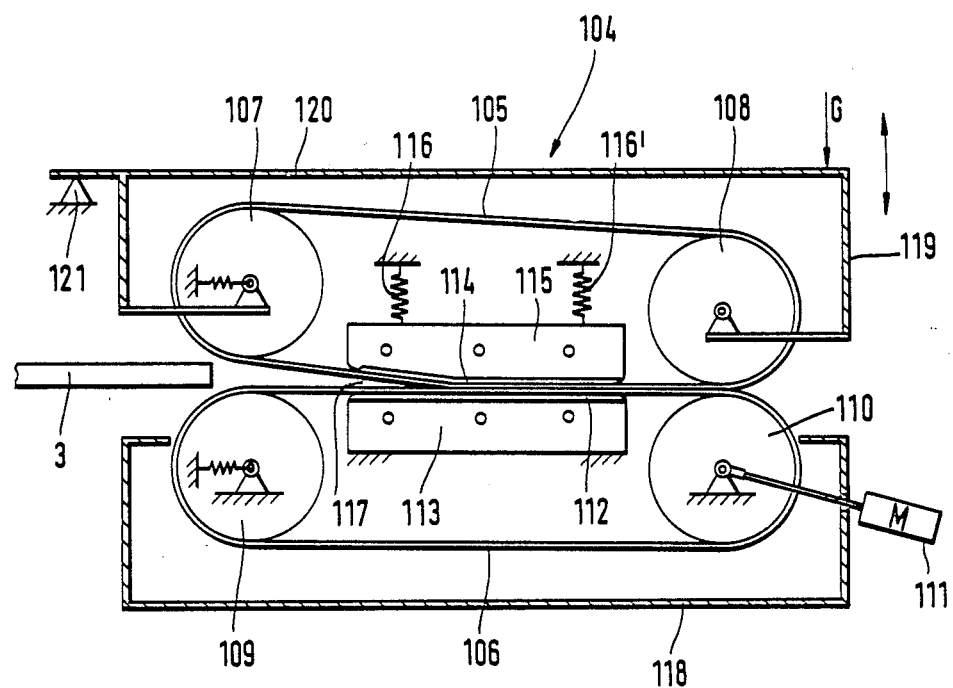
FIG. 8 shows a diagrammatic view of a heating device for heating the carrier.

FIG. 8 shows diagrammatically in a sectional view a heating device 104 which can take the place of the heating station 4 in FIG. 2. The heating device 104 has two revolving endless conveyor belts 105, 106, each of which is guided via two rollers 107, 108 and 109, 110 respectively.

The lower conveyor belt 106 is guided over transport roller 109 and drive roller 110, the latter being driven by a motor 111. The underside of the upper strand of the conveyor belt 106, when the conveyor belt revolves, slides in contact over a plane heating plate 112 of an electric heating element 113 fixed in position and is thereby heated. The upper non-driven conveyor belt 105 revolves via the transport rollers 107, 108 and is in slight pressure contact with the driven lower conveyor belt 106, so that it is taken up by the latter as a result of friction and the two conveyor belts run synchronously. The lower strand of the upper conveyor belt 105 slides in contact over a heating plate 114 of an upper electric heating element 115 which heats the conveyor belt. The heating plate of the electric heating element 115 is partially bevelled slightly in an upward direction, but is otherwise plane, so that the electric heating elements 113, 115 located opposite one another or their heating plates form a gap 117 narrowing in the direction of transport of the carrier 3.

The upper electric heating element 115 is suspended resiliently by means of tension springs 116, 116' which largely compensate its own weight, so that a carrier 3 grasped and transported further by the conveyor belts after it enters the nip 117 pushes the electric heating element 115 together with the upper conveyor belt 105 upwards until a clearance or gap between the conveyor belts which allows the carrier 3 to be transported through without difficulty, is formed. It is advantageous that the conveyor belts are always in contact with the top side and underside of the carrier 3 running through, the latter therefore being heated uniformly on both sides without interruption. The transport rollers 107 and 109 located opposite one another first in the direction of transport are at a clear distance from one another, whereas the rear transport roller 108 and the drive roller 110 are located opposite one another, separated only by the conveyor belts lying between them. The lower part and upper part of the heating device 104 are surrounded by a housing 118 and 119 respectively. The lower part is attached fixedly in place by means of its housing 118, whereas the upper part is suspended so as to oscillate by means of its housing 119. For this purpose, the covering surface 120 is extended beyond one side face of the housing 119 and mounted in a rocker bearing 121.

When there is no carrier 3 running through the heating device 104, the dead weight presses down the housing, as indicated by an arrow G. When the carrier 3 runs through between the rear transport roller 108 and the drive roller 110 in the heating device 104, the transport roller 108 is lifted, together with the housing 119, since, because its covering surface 120 is mounted in the rocker bearing 121, it can pivot upwards about the rocker bearing. The necessary gap for the carrier 3 can then form automatically between the rear rollers.

Instead of the heating station 4 or the heating device 104, it is also possible to use a heating device in which tubular heating elements above and below the path of the carrier heat the circulating air supplied by one or two fans. The carrier is then heated by the hot air which is blown onto the carrier by the fans via slit nozzles.

FIGS. 9a and 9b show a cutting device 122 with a heated cutting wire 134 for the photoresist film 14, this cutting device 122 being used, for example, instead of the cutting device 15 (see FIGS. 1 and 4) with the rotating knife. In this case, there is no need for the parts assigned to the cutting device 15, such as the motor 16, cross-member 33, clamping piece 34, knife carrier 35, gear 36, cam roller 37, cam piece 38, rack 72 and angular arms 73 of the embodiment illustrated in FIG. 4.

The cutting device 122 is pivotable about a pivot axle 124 which a motor 123 actuates. The pivot axle 124 is mounted in guides 143, 144 which can move up and down along the guide rods 29, 30 by means of a positioning device 145 and which can be fixed in a preselectable position. Located on the pivot axle 124 are two bearing blocks 125, 126, in each of which a bearing arm 127 and 128 respectively, one end of which passes through the bearing block, is mounted. The other ends of the bearing arms extend through a support 129, for example a hollow square tube, which carries on the underside fastening parts 130, 131 for ball bearings 132, 133, over which the heated cutting wire 134 is guided. One end of the cutting wire is attached fixedly in place, while the other end is connected to a spring 142 attached to the fastening part 131. The spring 142 always keeps the cutting wire 134 taut. The cutting wire 134 is heated by means of a current source 137, one pole of which is in contact with the first ball bearing 132 via a sliding contact 135. The other pole of the current source 137, which can be, for example, an alternating-current or direct-current source, is connected to one terminal of a microswitch 138, the other terminal of which is connected to the second ball bearing 133 via the sliding contact 136. Fastened horizontally to the bottom ends of mountings 146, 147, which are secured to the guides 143, 144 and which extend downwards from these, is a supporting rail 140 which has a continuous slot 14& in a body having, for example, a trapezoidal cross-section.

The positioning device 145 for the cutting device 122 consists, for example, of a spindle 150 engaged with a spindle nut 151 arranged on the rear side of one guide 144. A spindle motor 152 makes the spindle 150 rotate in a clockwise or anti-clockwise direction as required. A disk 153 fastened to the spindle 150 is designed, for example, as a slit disk or perforated disk and passes through a light barrier 154. During each complete revolution of the spindle or each complete passage of the disk 153 through the light barrier 154, the latter generates a pulse which is displayed in a counter 155 connected to the light barrier. The pitch of the spindle 150 can be selected, for example, so that a displacement of the cutting device 122 one millimeter up or down along the guide rods 29, 30 corresponds to one complete revolution of the spindle 150, and the numerical display of the counter 155 then indicates the particular position of the cutting device, that is to say the distance in millimeters from an initial or starting position. At the beginning of each new positioning operation, the cutting device 122 is automatically moved into its starting position, from which it then moves into the new position.

Other positioning devices familiar to a person skilled in the art are, of course, also suitable for the cutting device.

FIG. 9b shows the cutting device 122 diagrammatically in a sectional view during the cutting-through of the photoresist film 14. For the cutting operation, the support 129 with the cutting wire 134 is pivoted by means of the motor 123 along the path 149 in the direction of the supporting rail 140 for the photoresist film 14, and the cutting wire 134, when it penetrates into the slot 141 in the supporting rail 140, severs the photoresist film 14 resting on the supporting rail.

When the cutting wire 134 is in the cutting position, a switching lug 139 of the microswitch 138 rests against the supporting rail 140, so that the microswitch 138 is switched and the supply of current to the cutting wire 134 is interrupted. This ensures that when the cutting wire 134 is pivoted back into the position according to FIG. 9a, the cut edge of the photoresist film does not stick to the cooled cutting wire which, when it is pivoted back, is guided so as to brush over the cut edge. If the heating of the cutting wire is not switched off, the latter is so hot that, when it is pivoted back into the initial position, there would be a danger that it would stick to the photoresist film when it is brushed past the cut edge. The cutting wire 134 is appropriately surrounded by a shield which has been omitted in the drawing for the sake of greater clarity.

What is claimed is:

1. An apparatus for laminating a film under pressure and heat onto opposite sides of a carrier, said opposite sides each being heated before the laminating starts, comprising:

a single supply roll of a photoresist film to be laminated simultaneously to opposite sides of said carrier, said supply roll being mounted in a pivoting frame which is horizontally pivotable about a vertical axis, said pivoting frame being located behind an upper vacuum table of a laminating station in the direction of transport of the carrier;

a magazine for releasably suspending each of a plurality of carriers to be laminated, said carriers being vertically upstanding;

a heating station for heating the carriers, said heating station having two horizontally revolving endless conveyor belts, each of which is in contact with an electric heating element, said heating station being located in front of a laminating station in the direction of transport of the carrier;

said laminating station, comprising (i) a pair of laminating rollers forming a nip and (ii) a plurality of vertically aligned vacuum tables, each vacuum table of said plurality having a suction plate for vertically fixing the photoresist film;

a cutting device for cutting the photoresist film over the width of said film, wherein the cutting device is movable along vertical guide rods which extend vertically on both sides of the vacuum tables;

a knife carrier with a rack mounted pivotally on guides connected to one another by a cross-member and which can be displaced vertically and retained along the guide rods by a clamping piece or an electric positioning device;

roller conveyor means for moving the carrier horizontally along a path through said heating station, a lateral aligning device and a board gripper, there being a stop that is pivotable into and out of the path of the roller conveyor means such that when said stop is pivoted into said path, a front edge of the carrier abuts the stop;

said vacuum tables located vertically above and below the pair of laminating rollers;

a gripper bar which is a vacuum bar and is adapted to grasp a strip-shaped portion of the photoresist film, said gripper bar having two guides;

means for moving the gripper bar vertically downward along vertical guide rods parallel to one another out of an adjustable position above the laminating station, beyond the laminating station, and into a position in the region of the lower vacuum table; and a chain connection fastened to one of said two guides of the gripper bar, said chain connection being connected frictionally to an endless revolving drive chain which is guided around two chain wheels, wherein said gripper bar is movable, together with the two guides, along the vertical guide rods by said endless revolving drive chain.

2. The apparatus as claimed in claim 1, including means for coating a liquid layer onto the top side and underside of the horizontally transported carrier and arranged between the heating means and the laminating station.

3. The apparatus as claimed in claim 1, including means for coating a liquid layer onto the photoresist film, said coating means arranged near to a deflecting roller for the photoresist film.

4. The apparatus as claimed in claim 3, wherein a motor drives the deflecting roller, said deflecting roller serving as a transport roller for the photoresist film when said film is drawn off from a supply roll.

5. The apparatus as claimed in claim 4, further including a pressure and separating roller which rests against said deflecting roller and which separates a protective film removably adhered to the photoresist film, and wherein the protective film can be wound onto a take-up reel via said pressure and separating roller.

6. The apparatus as claimed in claim 4, further including a chain wheel located on the shaft of the deflecting roller, and around which is guided an endless drive chain guided around a further chain wheel.

7. The apparatus as claimed in claim 1, wherein a rail having a cutting edge along which the cutting device is moved over the photoresist film during the cutting operation, is attached to the cross-member of the guides and extending parallel to it at a predetermined distance.

8. The apparatus as claimed in claim 7, wherein a gear is engagable with the rack, is driven by a motor and is movable over the width of the photoresist film, and wherein said gear effects rotation of the cutting device attached thereto, said cutting device having the form of a rotary knife for cutting the photoresist film.

9. The apparatus as claimed in claim 7, further including an angular arm positioned on the knife carrier, a cam roller secured to the free end of said angular arm, and an angled cam piece fastened to one guide of the gripper bar, wherein said cam piece comes in contact with said cam roller when said gripper bar is raised, said cam roller thereby rolling on said cam piece and lifting said angular arm and said knife carrier, together with the cutting device off the surface of the photoresist film.

10. The apparatus as claimed in claim 1, wherein the parallel stop is fastened to two angle levers, said levers connected to one another by means of a cylindrical connecting member, and wherein the axle of said connecting member extends beyond the angle levers and is mounted rotatably in bearings.

11. The apparatus as claimed in claim 10, wherein a plate is fastened to the connecting member and on which an actuating cylinder engages to pivot the parallel stop into and out of the path of the carrier.

12. The apparatus as claimed in claim 10, wherein there are arranged on the parallel stop a pair of horizontally pivotable guide rollers which abut the longitudinal edges of the carrier when the front edge of said carrier rests against the parallel stop and is aligned.

13. The apparatus as claimed in claim 1, wherein the board gripper includes upper and lower horizontal clamping jaws between which are arranged springs surrounding drawbars, said springs effecting the opening of the board gripper, said upper clamping jaw pulled by a cylinder vertically downwards counter to the pressure force of said springs, until said upper clamping jaw rests against the top side of the carrier and grips the carrier.

14. The apparatus as claimed in claim 13, wherein the drawbars run in guides and pass through the clamping jaws, are connected to a cross-strut of the board gripper, and are screwed by wing nuts above the upper clamping jaw, and wherein the cylinder is fastened to the cross-strut.

15. The apparatus as claimed in claim 13, wherein two guide rods parallel to one another and extending horizontally through guide bearings are fastened to a support of the board gripper located underneath the clamping jaws of said board gripper, and wherein an actuating cylinder engages on the support and moves the board gripper to and fro horizontally.

16. The apparatus as claimed in claim 1, said apparatus further including a pivotable transport finger and a cylinder engagable with said finger, said cylinder positioning said finger against the rear edge of the carrier pushing forward said finger for the alignment of the front edge of the carrier at the parallel stop, and subsequently returning said finger to the initial position.

17. The apparatus as claimed in claim 1, wherein the suction plates of the vacuum tables have shaped bores arranged in rows and columns and connected to the interior of the vacuum table, said shaped bores being surrounded by grooves not connected to a vacuum.

18. The apparatus as claimed in claim 17, wherein the shaped bores are cup-shaped recesses in the suction plate, with a diameter of the shaped bores in the plane of the suction-plate surface of between 10 and 20 mm.

19. The apparatus as claimed in claim 17, wherein the grooves form a network consisting of two grid groups perpendicular to one another, and wherein the distance between the center lines of two adjacent parallel grooves is 15 to 25 mm.

20. The apparatus as claimed in claim 19, further including a web having a thickness of 1 to 1.5 mm at the narrowest point between the edge of the individual shaped bore and the surrounding grooves.

21. The apparatus as claimed in claim 17, wherein a cross-shaped web, the top edges of which end flush with the surface of the suction plate, is arranged in each shaped bore.

22. The apparatus as claimed in claim 18, wherein the grooves surround the shaped bores annularly, wherein a circular web 1 to 1.5 mm thick is present between the edge of the individual shaped bore and the surrounding groove, and wherein adjacent grooves overlap one another in the region of the nearest approach to the associated shaped bores.

23. The apparatus as claimed in claim 1, wherein there is fastened to the suction plate of the vacuum table a perforated plate with rectangular or square perforations of equal size, which are so arranged in rows and columns and the dimensions of which are such that four perforations lie over each one of the shaped bores in the suction plate.

24. The apparatus as claimed in claim 1, wherein each of the conveyor belts of the heating station is (A) guided over two rollers, such that the conveyor belts are in pressure contact with one another and form a gap which narrows in the direction of transport of the carrier and which is located in front of the plane region of contact of the conveyor belts, and (b) associated with an electric heating element, such that the heating element associated with one conveyor belt is fixed in position and the heating element associated with the other conveyer belt is suspended resiliently; and wherein the electric heating elements are located opposite one another.

25. The apparatus as claimed in claim 24, wherein the upper conveyor belt is surrounded by a housing, the covering surface of which is extended beyond one side face of the housing and is mounted in a rocker bearing.

26. The apparatus as claimed in claim 24, wherein the lower conveyor belt is surrounded by a housing fixed in position, wherein the rear roller is a drive roller which a motor drives, and wherein the lower conveyor belt takes up the upper conveyor belt as a result of friction and causes it to rotate.

27. The apparatus as claimed in claim 1, wherein the cutting device is pivotable about a pivot axle by a motor, and wherein the pivot axle is mounted in guides which are movable up and down along guide rods by a positioning device, and wherein there are located on the pivot axle two bearing blocks, through which extend bearing arms which by their ends facing away from the pivot axle pass through a support, to the underside of which fastening parts are attached.

28. The apparatus as claimed in claim 27, wherein said cutting device has a cutting wire which is guided over two ball bearings and which is heated by means of a current source.

29. An apparatus as claimed in claim 28, wherein one end of the cutting wire is attached fixedly in place to a first fastening part carrying one ball bearing, and wherein the other end of the cutting wire is connected to a spring fastened to a second fastening part for the other ball bearing and intended for tensioning the cutting wire.

30. The apparatus as claimed in claim 28, wherein one pole of said current source is connected to one ball bearing via a sliding contact, and the other pole is connected to the other ball bearing via a microswitch and a sliding contact connected in series with the latter.

31. An apparatus as claimed in claim 27, wherein a supporting rail for photoresist film is attached horizontally to mountings fastened to the pivot axle guides and has a continuous slot into which the cutting wire enters after the photoresist film spanning said supporting rail has been cut through.

32. An apparatus as claimed in claim 30, wherein, when the cutting wire is in the cutting position, a switching lug of the microswitch rests against the supporting rail, switches said microswitch and interrupts the supply of current to said cutting wire.

33. An apparatus as claimed in claim 27, wherein the positioning device consists of a spindle engaged with a spindle nut, a spindle motor causing said spindle to rotate, a perforated or slit disk resting on said spindle, and a light barrier.

34. An apparatus as claimed in claim 33, wherein the perforated or slit disk projects by means of its edge into the light barrier which is connected to a counter displaying each spindle revolution digitally.

35. The apparatus as claimed in claim 1, wherein said vacuum tables and said gripper bar position a drawn portion of the film vertically across said path at location between said stop and said pair of laminating rollers.

* * * * *